US012748154B2

(12) United States Patent
Lee

(10) Patent No.: US 12,748,154 B2
(45) Date of Patent: Sep. 29, 2026

(54) BATTERY DEVICE, BATTERY MANAGEMENT SYSTEM, AND DIAGNOSIS METHOD

(71) Applicant: LG Energy Solution, Ltd., Seoul (KR)

(72) Inventor: Hojoon Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 223 days.

(21) Appl. No.: 18/702,878

(22) PCT Filed: Sep. 23, 2022

(86) PCT No.: PCT/KR2022/014257

§ 371 (c)(1),
(2) Date: Apr. 19, 2024

(87) PCT Pub. No.: WO2023/075163

PCT Pub. Date: May 4, 2023

(65) Prior Publication Data

US 2025/0231245 A1 Jul. 17, 2025

(30) Foreign Application Priority Data

Nov. 1, 2021 (KR) ........................ 10-2021-0147895

(51) Int. Cl.
*G01R 31/3835* (2019.01)
*H02J 7/80* (2026.01)
*H02J 7/96* (2026.01)

(52) U.S. Cl.
CPC ............ *G01R 31/3835* (2019.01); *H02J 7/80* (2026.01); *H02J 7/96* (2026.01); *H02J 2207/50* (2020.01)

(58) Field of Classification Search
None
See application file for complete search history.

(56) References Cited

U.S. PATENT DOCUMENTS 5,804,973 A * 9/1998 Shinohara ............... B60L 50/60 324/548
2015/0219720 A1 8/2015 Huh
2018/0299500 A1 10/2018 Lee
(Continued)

FOREIGN PATENT DOCUMENTS

CN 211859635 U 11/2020
EP 2822132 A1 1/2015
JP 2009290978 A 12/2009
(Continued)

OTHER PUBLICATIONS

International Search Report for Application No. PCT/KR2022/014257 dated Jan. 2, 2023, 2 pages.
(Continued)

*Primary Examiner* — Jas A Sanghera
(74) *Attorney, Agent, or Firm* — Lerner David LLP

(57) ABSTRACT

A processor of a battery device performs a precharge operation by closing a precharge switch during a precharge duration, closing a positive main switch in response to the precharge operation being complete, and diagnosing the precharge operation based on a voltage of a positive connection terminal measured when the positive main switch is about to be closed and the voltage of the positive connection terminal measured as soon as the positive main switch is closed.

15 Claims, 6 Drawing Sheets

(56) References Cited

U.S. PATENT DOCUMENTS

| | | | |
|---|---|---|---|
| 2020/0144832 | A1 | 5/2020 | Kim |
| 2020/0412155 | A1 | 12/2020 | Choi et al. |

FOREIGN PATENT DOCUMENTS

| | | | |
|---|---|---|---|
| JP | 2013-179760 | A | 9/2013 |
| JP | 2013205257 | A | 10/2013 |
| JP | 2014-139058 | A | 7/2014 |
| JP | 6445989 | B2 | 12/2018 |
| KR | 100867834 | B1 | 11/2008 |
| KR | 101047635 | B1 | 7/2011 |
| KR | 20170097481 | A | 8/2017 |
| KR | 20180068370 | A | 6/2018 |
| KR | 2019-0128281 | A | 11/2019 |
| KR | 102065737 | B1 | 1/2020 |
| KR | 20200058995 | A | 5/2020 |
| KR | 102134825 | B1 | 7/2020 |

OTHER PUBLICATIONS

Extended European Search Report including Written Opinion for Application No. 22887367.5 dated Nov. 21, 2024, 7 pages.

* cited by examiner

【Figure 1】
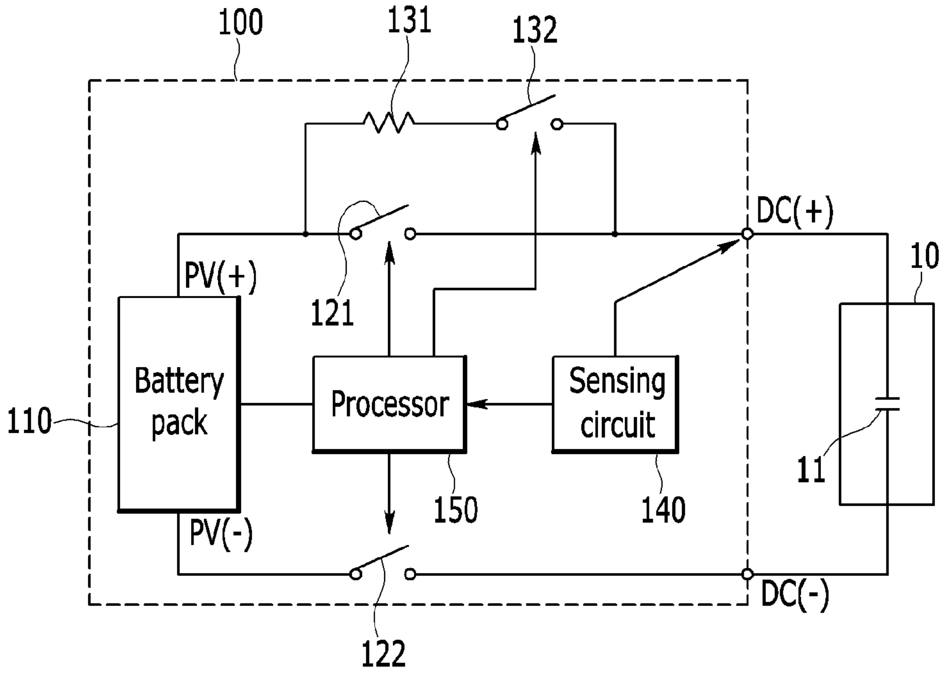

【Figure 2】
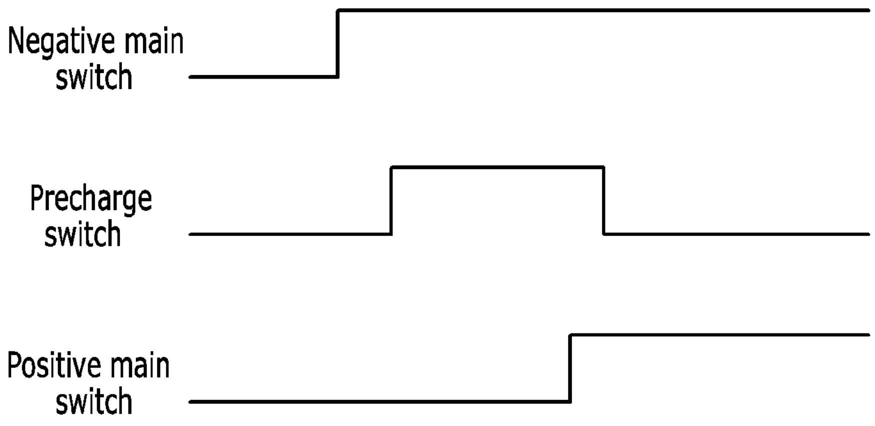

【Figure 3】
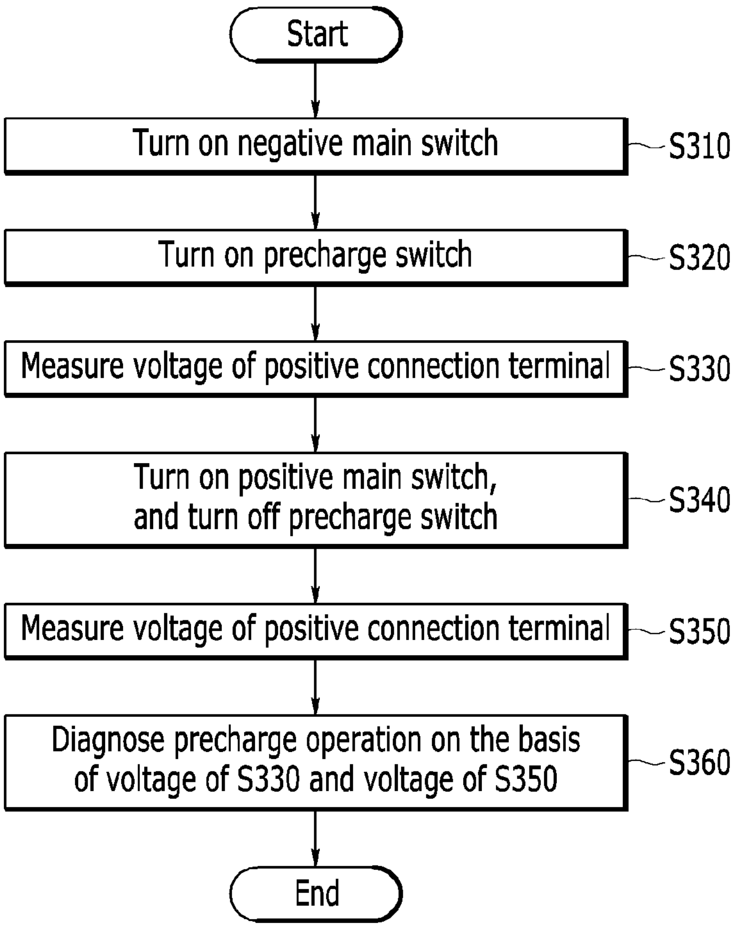

【Figure 4】
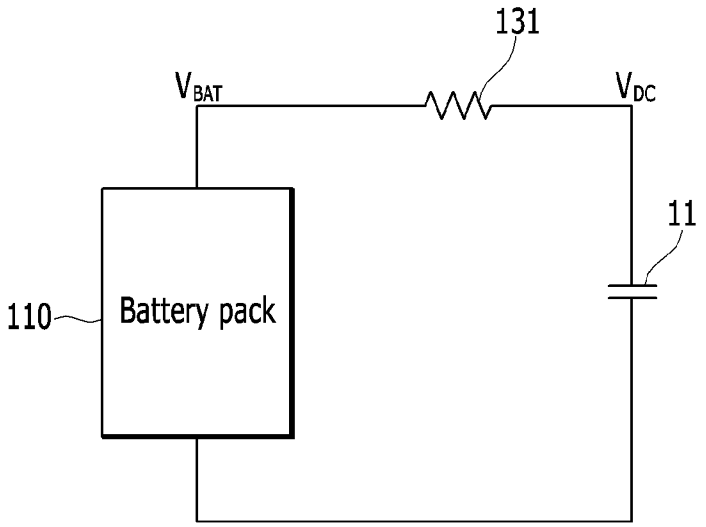

【Figure 5】
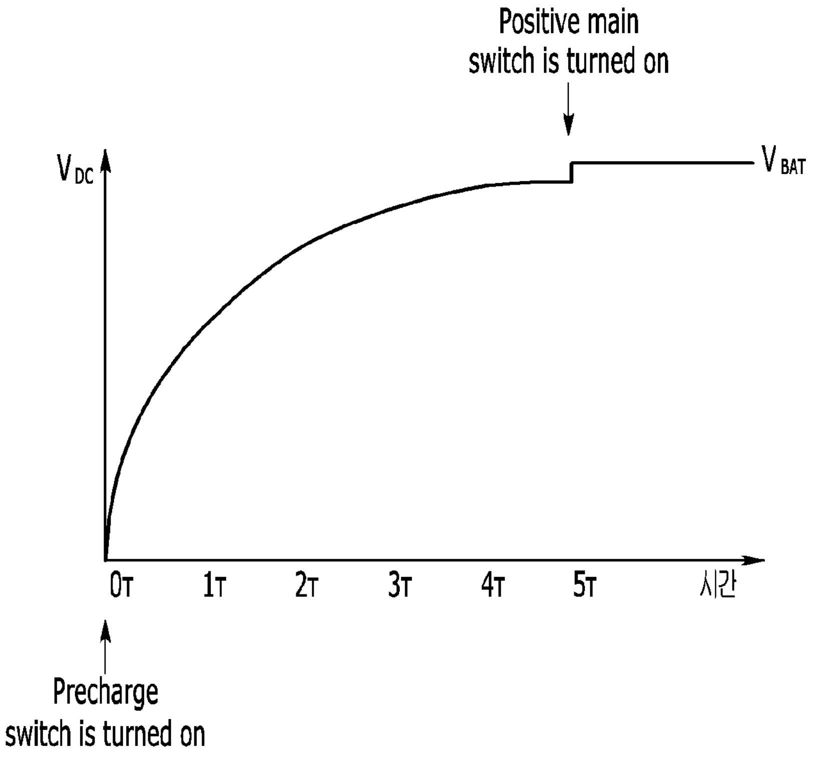

【Figure 6】
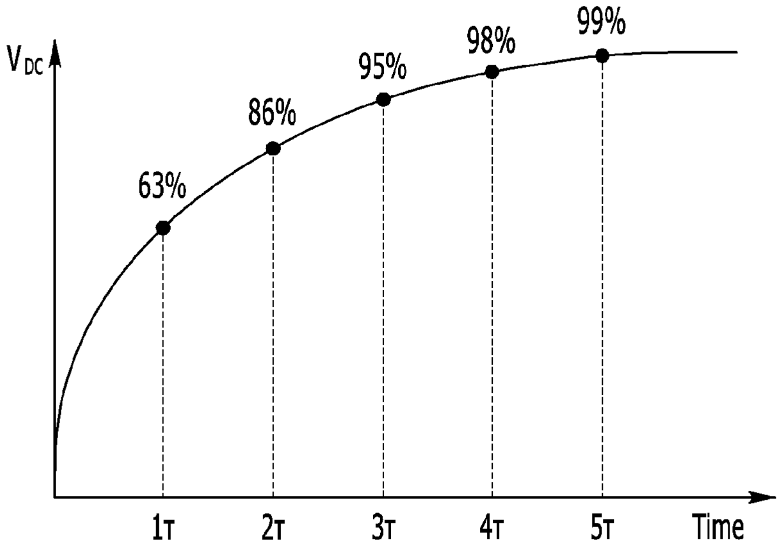

BATTERY DEVICE, BATTERY MANAGEMENT SYSTEM, AND DIAGNOSIS METHOD

CROSS-REFERENCE TO RELATED APPLICATION

The present application is a national phase entry under 35 U.S.C. § 371 of International Application No. PCT/KR2022/014257 filed Sep. 23, 2022, which claims priority from Korean Patent Application 10-2021-0147895 filed Nov. 1, 2021, all of which are incorporated herein by reference.

TECHNICAL FIELD

The disclosure relates to a battery device, a battery management system, and a diagnosis method.

BACKGROUND ART

Electric vehicles and hybrid vehicles are vehicles obtaining power by mainly using batteries as power sources for driving motors, and are alternatives capable of solving pollution and energy problems of internal combustion vehicles. For this reason, research has been actively carried out on them. Further, rechargeable batteries have been used in vehicles and even in various other external apparatuses.

Recently, as high-power high-capacity batteries have been required, battery packs including a plurality of battery cells connected in series or parallel have been used. Furthermore, the potential risk of battery packs has increased as their power and capacity have increased. Particularly, when an overcurrent flows in a battery pack, if the overcurrent is not diagnosed, due to the overcurrent, problems may occur in external devices.

In order to prevent rush current of such overcurrent which is generated in the initial stage of driving, precharge circuits have been used. Precharge circuits can prevent rush current by first charging capacitors connected to inverters and so on of external devices through precharge resistors in the initial stage of driving. By the way, if the time that it takes to precharge a capacitor is not sufficient, a main switch may be closed in the state where the capacitor has not been charged to a sufficient voltage. In this case, the main switch may be damaged due to the difference between the voltage of the battery pack and the voltage of the capacitor.

SUMMARY

The present invention has been made in an effort to provide a battery device, a battery management system, and a diagnosis method having advantages of being capable of diagnosing a precharge operation.

An embodiment of the present invention provides a battery device including a positive connection terminal and a negative connection terminal which are connected to an external device. The battery device may include a battery pack, a positive main switch, a precharge switch, and a processor. The positive main switch may be connected between a positive terminal of the battery pack and the positive connection terminal. The precharge switch may be connected between the positive terminal of the battery pack and the positive connection terminal to control a precharge operation of a capacitor of the external device. The processor may perform a precharge operation by closing the precharge switch during a precharge duration, and close the positive main switch in response to the precharge operation being complete, and diagnose the precharge operation based on of a first voltage of the positive connection terminal when the positive main switch is about to be closed and a second voltage of the positive connection terminal as soon as the positive main switch is closed.

In some embodiments, the battery device may further include a precharge resistor connected between the positive terminal and the positive connection terminal.

In some embodiments, the precharge switch and the precharge resistor may be connected in series.

In some embodiments, the processor may calculate the ratio of the second voltage to the first voltage, and diagnose the precharge operation by comparing the ratio of the second voltage to the first voltage with a criterion ratio.

In some embodiments, the precharge duration may be set to a multiple of a time constant computed by a resistance value of the precharge resistor and a capacitance of the capacitor, and the criterion ratio may be a ratio based on the multiple of the time constant.

In some embodiments, in response to the ratio of the second voltage to the first voltage being within an error range of the criterion ratio, the processor may be configured to determine that the precharge operation is normal.

In some embodiments, the precharge duration may be equal to. The processor may be configured to calculate the ratio of the second voltage to the first voltage, and determine a secondtime constant corresponding to the ratio of the second voltage to the first voltage, and diagnose the precharge operation based on a copariosn of the time constant with the second time constant.

In some embodiments, in response to the second time constant being within an error range of the time constant, the processor may be configured to determine that the precharge operation is normal.

In some embodiments, the processor may be configured to calculate the ratio of the second voltage to the first voltage, and determine a multiple of the time constant corresponding to the ratio of the second voltage to the first voltage, and estimate the capacitance of the capacitor on the basis of the multiple of the time constant, the precharge duration, and the resistance value of the precharge resistor, and determine the precharge operation based on a comparison of an estimated capacitance and an actual capacitance of the capacitor.

In some embodiments, in response to the estimated capacitance being within an error range of the actual capacitance, the processor may be configured to determine that the precharge operation is normal.

Another embodiment of the present invention provides a diagnosis method of a battery device including a battery pack, and a positive connection terminal and a negative connection terminal to be connected to an external device. The diagnosis method may include precharging a capacitor connected to the positive connection terminal and the negative connection terminal through a precharge resistor, applying a voltage of the battery pack to the positive connection terminal after performing the precharging, measuring a voltage of the positive connection terminal as a first voltage when the voltage of the battery pack is about to be applied, measuring the voltage of the positive connection terminal as a second voltage as soon as the voltage of the battery pack is applied, and diagnosing the precharging based on the first voltage and the second voltage.

In some embodiments, the diagnosing may include calculating a ratio of the second voltage to the first voltage, wherein diagnosing the precharging is based on a comparison of the ratio of the second voltage to the first voltage with a criterion ratio.

In some embodiments, the precharge duration may be equal to the time constant compuited by a resistance value of aprecharge resistor and a capacitance of a capacitor. The diagnosing may include calculating the ratio of the second voltage to the first voltage, determining a second time constant corresponding to the ratio of the second voltage to the first voltage, and diagnosing the prechraging based on a comparison of the time constant and the second time constant.

In some embodiments, diagnosing the precharging may include calculating a ratio of the second voltage to the first voltage, determining a multiple of the time constant corresponding to the ratio of the second voltage to the first voltage, estimating the capacitance of the capacitor based on the multiple of the time constant, the precharge duration, and the resistance value of the precharge resistor, wherein diagnosing the precharging is based on a comparison of the estimated capacitance and the actual capacitance of the capacitor.

Yet another embodiment of the present invention provides a battery management system of a battery device including a battery pack, and a positive connection terminal and a negative connection terminal to be connected to an external device. The battery management system may include a positive main switch, a precharge switch, and a processor. The positive main switch may be connected between the positive terminal of the battery pack and the positive connection terminal. The precharge switch may be connected between the positive terminal of the battery pack and the positive connection terminal to control a precharge operation of a capacitor of the external device. The processor may be configured to perform a precharging operation by closing the precharge switch during a precharge duration, and close the positive main switch in response to the precharge operation being complete, and diagnose the precharge operation based on a first voltage of the positive connection terminal when the positive main switch is about to be closed and a second voltage of the positive connection terminal as soon as the positive main switch is closed.

According to some embodiments, it is possible to diagnose a precharge operation by measuring the voltage of the positive connection terminal.

BRIEF DESCRIPTION OF THE DRAWINGS

FIG. 1 is a drawing illustrating an example of a battery device according to an embodiment.

FIG. 2 is a drawing illustrating an example of switching timings in the battery device according to the embodiment.

FIG. 3 is a flow chart illustrating an example of a diagnosis method of a battery device according to an embodiment.

FIG. 4 is a drawing illustrating an example of an equivalent circuit of a battery device according to an embodiment during a precharge duration.

FIG. 5 is a drawing illustrating an example of the voltage of a positive connection terminal in a battery device according to an embodiment.

FIG. 6 is a drawing illustrating voltage ratios depending on multiples of a time constant.

DETAILED DESCRIPTION

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

It should be understood that when a constituent element is referred to as being "connected" to another constituent element, it may be directly connected to the other constituent element, or other constituent elements may be present between them. In contrast, it should be understood that when a constituent element is referred to as being "directly connected" to another constituent element, there is no other constituent element between them.

In the following description, expressions written in the singular forms can be comprehended as the singular forms or plural forms unless clear expressions such as "a", "an", or "single" are used.

In the flow charts described with reference to the drawings, the order of operations may be changed, and several operations may be combined, and an operation may be divided, and some operations may not be performed.

FIG. 1 is a drawing illustrating an example of a battery device according to an embodiment, and FIG. 2 is a drawing illustrating an example of switching timings in the battery device according to the embodiment.

Referring to FIG. 1, a battery device 100 has such a structure that it can be electrically connected to an external device 10 through a positive connection terminal DC(+) and a negative connection terminal DC(−). In the case where the external device is a load, the battery device 100 operates as a power source for supplying power to the load, thereby being discharged. The external device 10 operating as a load may be, for example, an electronic apparatus, a transportation means, or an energy storage system (ESS), and the transportation means may be, for example, an electric vehicle, a hybrid vehicle, or smart mobility.

The battery device 100 includes a battery pack 110, a switch circuit, a precharge circuit, a sensing circuit 140, and a processor 150.

The battery pack 110 includes a plurality of battery cells (not shown in the drawings), and has a positive terminal PV(+) and a negative terminal PV(−). In some embodiments, the battery cells may be secondary batteries which are rechargeable. In an embodiment, in the battery pack 110, a predetermined number of battery cells may be connected in series to constitute a battery module, and supply desired power. In another embodiment, in the battery pack 110, a predetermined number of battery modules may be connected in series or in parallel, and supply desired power.

The switch circuit includes a positive main switch 121 connected between the positive terminal PV(+) of the battery pack 110 and the positive connection terminal DC(+) of the battery device 100, and a negative main switch 122 connected between the negative terminal PV(−) of the battery pack 110 and the negative connection terminal DC(−) of the battery device 100. In an embodiment, each of the switches 121 and 122 may be a contactor composed of a relay. In another embodiment, each of the switches 121 and 122 may be an electric switch such as a transistor. In some embodiments, the switch circuit may further include driver circuits (not shown in the drawings) which control the switches 121 and 122, respectively.

The precharge circuit is connected between the positive terminal PV(+) of the battery pack 110 and the positive connection terminal DC(+) of the battery device 100, and can first charge a capacitor 11 of the external device 10 which is connected to the connection terminals DC(+) and DC(−) during a precharge duration. In some embodiments, the precharge circuit may include a precharge resistor 131 and a precharge switch 132. In the case where the precharge switch 132 is closed, the precharge resistor 131 can be connected between the positive terminal PV(+) of the battery pack 110 and the positive connection terminal DC(+) of the battery device 100. Accordingly, the precharge circuit can first charge the capacitor 11 of the external device 10 through the precharge resistor 131. In some embodiments, the precharge resistor 131 and the precharge switch 132 may be connected in series between the positive terminal PV(+) of the battery pack 110 and the positive connection terminal DC(+) of the battery device 100. In an embodiment, the precharge switch 132 may be a contactor composed of a relay. In another embodiment, the precharge switch 132 may be an electric switch such as a transistor. In some embodiments, the precharge circuit may further include a driver circuit (not shown in the drawings) which controls the precharge switch 132.

The sensing circuit 140 senses the voltage on a predetermined point in the battery device 100. In some embodiments, the sensing circuit 140 may sense the voltage of the positive connection terminal DC(+) of the battery device 100. In some embodiments, the sensing circuit 140 may include a plurality of resistors (not shown in the drawings) connected in series between the positive connection terminal DC(+) and a ground terminal. In this case, the sensing circuit 140 may sense a voltage obtained by dividing the voltage of the positive connection terminal DC(+) by the plurality of resistors, as the voltage of the positive connection terminal DC(+). In some embodiments, the sensing circuit 140 may further include an analog-to-digital converter which converts the voltage obtained by the voltage division using the plurality of resistors into a digital signal, and transmits the digital signal to the processor 150.

The processor 150 may control the operations of the switches 121, 122, and 132. Also, the processor 150 may diagnose a precharge operation on the basis of the voltage sensed by the sensing circuit 140. In some embodiments, the processor 150 may diagnose the capacitance of the capacitor 11 on the basis of the voltage sensed by the sensing circuit 140. In some embodiments, the processor 150 may be, for example, a micro controller unit (MCU).

In some embodiments, the sensing circuit 140 and the processor 150 may be included in a battery management system (BMS) of the battery device.

Referring to FIG. 2, during initial driving of the battery device, the processor 150 first closes the negative main switch 122. Next, the processor 150 closes the precharge switch 132 in the state where the negative main switch 122 is closed. Accordingly, precharge current can be supplied from the battery pack 110 to the capacitor 11 of the external device 10 through the precharge resistor 131, whereby the capacitor 11 can be charged. The duration when the precharge switch 132 is closed, whereby the capacitor 11 is charged may be referred to as a precharge duration.

Next, after charging the capacitor 11 of the external device 10, the processor 150 closes the positive main switch 121 in order to transmit the voltage of the battery pack 110 to the external device 10. In this case, since precharge has been completed, the processor 150 can open the precharge switch 132. Therefore, it is possible to prevent rush current from occurring when the voltage of the battery pack 110 is supplied to the external device 10 by the voltage to which the capacitor 11 of the external device 10 has been charged.

Closing a switch may be referred to as turning on the switch, and opening a switch may be referred to as turning off the switch.

Now, precharge operation diagnosis methods according to various embodiments will be described with reference to FIG. 3 to FIG. 6.

FIG. 3 is a flow chart illustrating an example of a diagnosis method of a battery device according to an embodiment, and FIG. 4 is a drawing illustrating an example of an equivalent circuit of a battery device according to an embodiment during a precharge duration. FIG. 5 is a drawing illustrating an example of the voltage of a positive connection terminal in a battery device according to an embodiment, and FIG. 6 is a drawing illustrating voltage ratios depending on multiples of a time constant.

Referring to FIG. 3, the processor (for example, reference numeral 150 in FIG. 1) of the battery device closes the negative main switch (for example, reference numeral 122 in FIG. 1) (S310), and closes the precharge switch (for example, reference numeral 132 in FIG. 1) (S320). Accordingly, a precharge duration starts, and the capacitor (for example, reference numeral 11 in FIG. 1) of the external device can be charged.

After performing the precharge operation (for example, when the precharge duration ends), the processor 150 closes the positive main switch (for example, reference numeral 121 in FIG. 1) (S340). The processor 150 may apply the voltage of the battery pack 110 to the positive connection terminal DC(+) by closing the positive main switch 121. Immediately before closing the positive main switch 121 (for example, immediately before applying the voltage of the battery pack 110 to the positive connection terminal DC(+)), the processor 150 measures the voltage of the positive connection terminal (for example, reference symbol DC(+)) of the battery device sensed by the sensing circuit (for example, reference numeral 140 in FIG. 1) (S330). Also, immediately after closing the positive main switch 121 (for example, immediately after applying the voltage of the battery pack 110 to the positive connection terminal DC(+)), the processor 150 measures the voltage of the positive connection terminal (DC(+)) of the battery device sensed by the sensing circuit 140 (S350). In some embodiments, after closing the positive main switch 121, the processor 150 may open the precharge switch 132 (S340).

The processor 150 diagnoses a precharge operation on the basis of the voltage of the positive connection terminal (DC(+)) of the battery device measured immediately before it closed the positive main switch 121 and the voltage of the positive connection terminal (DC(+)) of the battery device measured immediately after it closed the positive main switch 121 (S360).

In some embodiments, in the case of diagnosing that a precharge operation is abnormal, the processor 150 may transmit a warning to the external device.

As shown in FIG. 4, when the precharge switch 132 is closed, an RC equivalent circuit may be formed by the battery pack 110, the precharge resistor 131, and the capacitor 11. Then, the voltage of the capacitor 11, that is, the voltage $V_{DC}$ of the positive connection terminal DC(+) increases on the basis of the time constant t of an RC equivalent circuit, as shown in FIG. 5. In this case, the voltage $V_{DC}$ of the capacitor 11 may vary, for example, as Equation 1.

$$V_{DC} = V_{EAT}\left(1 - e^{-t/\tau}\right) \quad \text{(Equation 1)}$$

In Equation 1, the time constant t is defined as the product of the resistance value $R_P$ of the precharge resistor 131 and the capacitance $C_{EX}$ of the capacitor 11.

The processor 150 may set n times the time constant as a precharge duration (wherein n is a positive real number). For example, the processor 150 may set 5 times the time constant as the precharge duration. In this case, the processor 150 may theoretically calculate the voltage $V_{DC}$ of the positive connection terminal DC(+) when the precharge duration corresponding to n times the time constant elapses. As the voltage $V_{DC}$ of the positive connection terminal DC(+) theoretically calculated, a predetermined ratio to the voltage $V_{BAT}$ of the battery pack 110 may be given. As shown in FIG. 6, the voltage $V_{DC}$ of the positive connection terminal DC(+) at 1 times the time constant (τ) corresponds to 63% of the voltage $V_{BAT}$ of the battery pack 110, and the voltage $V_{DC}$ of the positive connection terminal DC(+) at 2 times the time constant (2τ) corresponds to 86% of the voltage $V_{BAT}$ of the battery pack 110, and the voltage $V_{DC}$ of the positive connection terminal DC(+) at 3 times the time constant (3τ) corresponds to 95% of the voltage $V_{BAT}$ of the battery pack 110, and the voltage $V_{DC}$ of the positive connection terminal DC(+) at 4 times the time constant (4τ) corresponds to 98% of the voltage $V_{BAT}$ of the battery pack 110, and the voltage $V_{DC}$ of the positive connection terminal DC(+) at 5 times the time constant (5τ) corresponds to 99% of the voltage $V_{BAT}$ of the battery pack 110.

Meanwhile, shown in FIG. 5, immediately after the positive main switch 121 is closed, the voltage of the positive connection terminal DC(+) is changed to the voltage $V_{BAT}$ of the battery pack 110. The voltage of the positive connection terminal DC(+) measured immediately after the positive main switch 121 was closed corresponds to the voltage $V_{BAT}$ of the battery pack 110. Therefore, the processor 150 may diagnose the precharge operation by comparing the voltage $V_{DC}$ of the positive connection terminal DC(+) measured immediately before the positive main switch 121 was closed (the voltage of the capacitor 11 measured when the precharge duration ended), and the voltage $V_{BAT}$ of the positive connection terminal DC(+) (the voltage of the battery pack 110) measured immediately after the positive main switch 121 was closed. Further, the processor 150 may estimate the time constant on the basis of the voltage $V_{DC}$ of the positive connection terminal DC(+) measured immediately before the positive main switch 121 was closed, and the voltage $V_{BAT}$ of the positive connection terminal DC(+) measured immediately after the positive main switch 121 was closed. For example, the time constant τ can be calculated from Equation 1 by setting the voltage of the positive connection terminal DC(+) measured immediately before the positive main switch 121 was closed, the voltage of the positive connection terminal DC(+) measured immediately after the positive main switch 121 was closed, and the time of the precharge duration of the current cycle as $V_{DC}$, $V_{BAT}$, and t, respectively.

In some embodiments, the processor 150 may diagnose the precharge operation by comparing the ratio of the voltage $V_{BAT}$ of the positive connection terminal DC(+) measured immediately after the positive main switch 121 was closed to the voltage $V_{DC}$ of the positive connection terminal DC(+) measured immediately before the positive main switch 121 was closed, with the ratio corresponding to a predetermined multiple of the time constant actually set as the precharge duration (hereinafter, referred to as "criterion ratio"). In an embodiment, in the case where the ratio calculated on the basis of the voltage of the positive connection terminal DC(+) is included in an error range of the criterion ratio, the processor 150 may diagnose that the precharge operation is normal. In the case where the ratio calculated on the basis of the voltage of the positive connection terminal DC(+) is out of the error range of the criterion ratio, the processor 150 may diagnose that the precharge operation is abnormal. In other words, the processor 150 may diagnose that since the difference between the voltage of the capacitor 11 immediately before the positive main switch 121 was closed and the voltage of the battery pack 110 is large, damage to the positive main switch 121 may occur.

In some embodiments, the processor 150 may calculate how many times the time constant the precharge duration is, on the basis of the ratio of the voltage $V_{BAT}$ of the positive connection terminal DC(+) measured immediately after the positive main switch 121 was closed to the voltage $V_{DC}$ of the positive connection terminal DC(+) measured immediately before the positive main switch 121 was closed. The set precharge duration may be n times the time constant, and the calculated precharge duration may be m times the time constant (wherein m is a positive real number). In this case, when m is within an error range of n, the processor 150 may diagnose that the precharge operation is normal. On the other hand, in the case where m is out of the error range of n, the processor 150 may diagnose that the precharge operation is abnormal.

In some embodiments, the processor 150 may estimate the capacitance of the capacitor 11 on the basis of the ratio of the voltage $V_{BAT}$ of the positive connection terminal DC(+) measured immediately after the positive main switch 121 was closed to the voltage $V_{DC}$ of the positive connection terminal DC(+) measured immediately before the positive main switch 121 was closed. The processor 150 may calculate how many times the time constant the precharge duration is, on the basis of the ratio of the voltage $V_{BAT}$ of the positive connection terminal DC(+) measured immediately after the positive main switch 121 was closed to the voltage $V_{DC}$ of the positive connection terminal DC(+) measured immediately before the positive main switch 121 was closed. In the case where the calculated precharge duration is m times the time constant, the processor 150 may calculate the time constant by dividing the precharge duration ($T_P$) by m ($T_P/m$), and estimate the capacitance of the capacitor 11 ($T_P/(m*R_P)$) by dividing the time constant by the resistance ($R_P$) of the precharge resistor 131. In the case where the estimated capacitance is within an error range of the actual capacitance of the capacitor 11, the processor 150 may diagnose that the precharge operation is normal. On the other hand, in the case where the estimated capacitance is out of the error range of the actual capacitance, the processor 150 may diagnose that the precharge operation is abnormal.

In some embodiments, the error range may be determined by experiments.

For example, it is assumed that the precharge duration is set to 5 times the time constant, and the voltage of the battery pack 110 is 400 V, and the resistance value of the precharge resistor 131 is 40Ω, and the actual capacitance of the capacitor 11 is 1700 μF. In this case, the time constant is set to 68 ms (=40 Ω*1700 μF), and the precharge duration is set to 340 ms (=5*68 ms).

In the case where the voltage of the positive connection terminal DC(+) immediately before closing the positive main switch 121 is 396 V, the ratio of the voltage of the positive connection terminal DC(+) immediately after closing the positive main switch 121 to the voltage of the positive connection terminal DC(+) immediately before closing the positive main switch 121 is 99%. Since the calculated ratio is equal to the ratio at 5 times the time constant, the processor 150 may diagnose that the precharge operation is normal.

On the other hand, in the case where the voltage of the positive connection terminal DC(+) immediately before closing the positive main switch 121 is 380 V, the ratio of the voltage of the positive connection terminal DC(+) immediately after closing the positive main switch 121 to the voltage of the positive connection terminal DC(+) immediately before closing the positive main switch 121 is 95%. In this case, as the precharge duration, 3 times the time constant may be calculated. Further, as the capacitance of the capacitor 11, 2833 μF (=340 ms/(3*40Ω)) may be estimated. Therefore, the calculated ratio (95%) is 4% lower than the actual ratio (99%), or the calculated multiple of the time constant (3 times the time constant) corresponds to 60% of the actual multiple of the time constant (5 times the time constant), or the estimated capacitance corresponds to 167% of the actual capacitance. So, the processor 150 may diagnose that the precharge duration is abnormal.

According to the embodiments described above, the battery device can diagnose whether the precharge operation is normal, by measuring the voltage of the positive connection terminal DC(+). Further, since the voltage of the positive connection terminal DC(+) is measured immediately before the positive main switch 121 is closed and immediately after the positive main switch 121 is closed, it is possible to minimize the difference between the two voltage measurement time points. In other words, since the two voltage measurements are performed in substantially the same environment, it is possible to minimize errors in elements related to voltage measurement, thereby accurately estimating the time constant or the capacitance.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery device having a positive connection terminal and a negative connection terminal to be connected to an external device, comprising:
- a battery pack;
- a positive main switch connected between a positive terminal of the battery pack and the positive connection terminal;
- a precharge switch connected between the positive terminal of the battery pack and the positive connection terminal to control a precharge operation of a capacitor of the external device; and
- a processor configured to:
- perform a precharge operation by closing the precharge switch during a precharge duration;
- close the positive main switch in response to the precharge operation being complete; and
- diagnose the precharge operation based on a first voltage of the positive connection terminal when the precharge duration ends and before the positive main switch is closed and a second voltage of the positive connection terminal as soon as the positive main switch is closed.

2. The battery device of claim 1, further comprising:
- a precharge resistor connected between the positive terminal and the positive connection terminal.

3. The battery device of claim 2, wherein:
- the precharge switch and the precharge resistor are connected in series.

4. The battery device of claim 2, wherein:
- the processor is configured to:
- calculate a ratio of the second voltage to the first voltage; and
- diagnose the precharge operation based on a comparison of the ratio of the second voltage to the first voltage with a criterion ratio.

5. The battery device of claim 4, wherein:
- the precharge duration is a multiple of a time constant computed by a resistance value of the precharge resistor and a capacitance of the capacitor, and
- the criterion ratio is based on the multiple of the time constant.

6. The battery device of claim 4, wherein:
- in response to the ratio of the second voltage to the first voltage being within an error range of the criterion ratio, the processor is configured to determine that the precharge operation is normal.

7. The battery device of claim 5, wherein:
- the precharge duration is equal to the time constant, and
- the processor is configured to:
- calculate the ratio of the second voltage to the first voltage;
- determine a second time constant corresponding to the ratio of the second voltage to the first voltage; and
- diagnose the precharge operation based on a comparison of-the time constant with the second time constant.

8. The battery device of claim 7, wherein:
- in response to the second time constant being within a predetermined error range of the time constant, the processor is configured to determine that the precharge operation is normal.

9. The battery device of claim 5, wherein:
- the time constant is computed by the resistance value of the precharge resistor and the capacitance of the capacitor, and
- the processor is configured to:
- calculate the ratio of the second voltage to the first voltage;
- determine a multiple of the time constant corresponding to the ratio of the second voltage to the first voltage;
- estimate the capacitance of the capacitor based on the multiple of the time constant, the precharge duration, and the resistance value of the precharge resistor; and
- diagnose the precharge operation based on a comparison of an estimated capacitance and an actual capacitance of the capacitor.

10. The battery device of claim 9, wherein:
- in response to the estimated capacitance being within an error range of the actual capacitance, the processor is configured to determine that the precharge operation is normal.

11. A diagnosis method of a battery device including a battery pack, and a positive connection terminal and a negative connection terminal to be connected to an external device, comprising:
- precharging a capacitor connected to the positive connection terminal and the negative connection terminal through a precharge resistor during a precharge duration;
- applying a voltage of the battery pack to the positive connection terminal after performing the precharging;
- measuring a voltage of the positive connection terminal as a first voltage when the precharge duration ends and before the voltage of the battery pack is applied;

measuring the voltage of the positive connection terminal as a second voltage as soon as the voltage of the battery pack is applied; and diagnosing the precharging based on the first voltage and the second voltage.

12. The diagnosis method of claim 11, further comprising:

calculating a ratio of the second voltage to the first voltage, wherein diagnosing the precharging is based on a comparison of the ratio of the second voltage to the first voltage with a criterion ratio.

13. The diagnosis method of claim 11, wherein:

the precharge duration is a time constant computed by a resistance value of the precharge resistor and a capacitance of the capacitor, and wherein the method further comprises:

calculating a ratio of the second voltage to the first voltage; and determining a second time constant corresponding to the ratio of the second voltage to the first voltage, wherein diagnosing the precharging is based on a comparison of the time constant and the second time constant.

14. The diagnosis method of claim 11, wherein:

a time constant is defined by a resistance value of the precharge resistor and a capacitance of the capacitor, wherein the method further comprises:

calculating a ratio of the second voltage to the first voltage;

determining a multiple of the time constant corresponding to the ratio of the second voltage to the first voltage; and estimating the capacitance of the capacitor based on the multiple of the time constant, the precharge duration, and the resistance value of the precharge resistor, wherein diagnosing the precharging is based on a comparison of the estimated capacitance and an actual capacitance of the capacitor.

15. A battery management system of a battery device including a battery pack, and a positive connection terminal and a negative connection terminal to be connected to an external device, comprising:

a positive main switch connected between a positive terminal of the battery pack and the positive connection terminal;

a precharge switch connected between the positive terminal of the battery pack and the positive connection terminal to control a precharge operation of a capacitor of the external device; and a processor, wherein the processor is configured to:

perform a precharge operation by closing the precharge switch during a precharge duration;

close the positive main switch in response to the precharge operation being complete; and diagnose the precharge operation based on a first voltage of the positive connection terminal when the precharge duration ends and before the positive main switch is closed and a second voltage of the positive connection terminal as soon as the positive main switch is closed.

* * * * *